United States Patent [19]
Abbott

[11] Patent Number: 6,080,494
[45] Date of Patent: Jun. 27, 2000

[54] METHOD TO MANUFACTURE BALL GRID ARRAYS WITH EXCELLENT SOLDER BALL ADHESION FOR SEMICONDUCTOR PACKAGING AND THE ARRAY

[75] Inventor: Donald C. Abbott, Norton, Mass.

[73] Assignee: Texas Instruments Incorporated, Dallas, Tex.

[21] Appl. No.: 09/141,857

[22] Filed: Aug. 28, 1998

Related U.S. Application Data

[60] Provisional application No. 60/057,404, Aug. 29, 1997.

[51] Int. Cl.[7] .......................... H01L 23/48; B23K 101/40
[52] U.S. Cl. .......................... 428/621; 428/670; 428/675; 428/209; 228/180.22; 361/771
[58] Field of Search .................................. 428/670, 675, 428/626, 621, 620, 643, 929, 645, 646, 209, 137, 309.9; 228/179.1, 180.22; 361/779, 771

[56] References Cited

U.S. PATENT DOCUMENTS

| | | | |
|---|---|---|---|
| 3,839,727 | 10/1974 | Herdzik et al. | 357/71 |
| 5,376,584 | 12/1994 | Argarwala | 437/183 |
| 5,783,461 | 7/1998 | Hembree | 438/17 |
| 5,912,507 | 6/1999 | Dunn et al. | 257/767 |

FOREIGN PATENT DOCUMENTS

| | | |
|---|---|---|
| 9-306945 | 11/1997 | Japan . |
| 10-56095 | 2/1998 | Japan . |
| 11-121529 | 4/1999 | Japan . |

*Primary Examiner*—John J. Zimmerman
*Attorney, Agent, or Firm*—Wade James Brady, III; Frederick J. Telecky, Jr.

[57] ABSTRACT

A method of fabricating a ball grid array and the array. The method comprises the steps of providing an electrically insulating substrate and forming an essentially gold-free solder ball attach region and wire bond region secured to the substrate. Formation of the solder ball attach and wire bond regions includes forming a layer of electrically conductive material on the substrate, forming a layer of nickel over the layer of electrically conductive material and forming a layer of palladium over the layer of nickel. After chip attach and gold wire bonding or flip chip bonding, solder balls are then applied to the layer of palladium and the solder balls and solder ball attach regions are heated to a temperature sufficiently high and for a sufficient time so that the solder balls extend through and incorporate therein at least a portion of the layer of said palladium and extend to and attach to the layer of nickel. The substrate is preferably one of polyimide or ceramic and the electrically conductive material is preferably copper. The layer of palladium has a thickness of from about 3 to about 10 microinches.

16 Claims, 1 Drawing Sheet

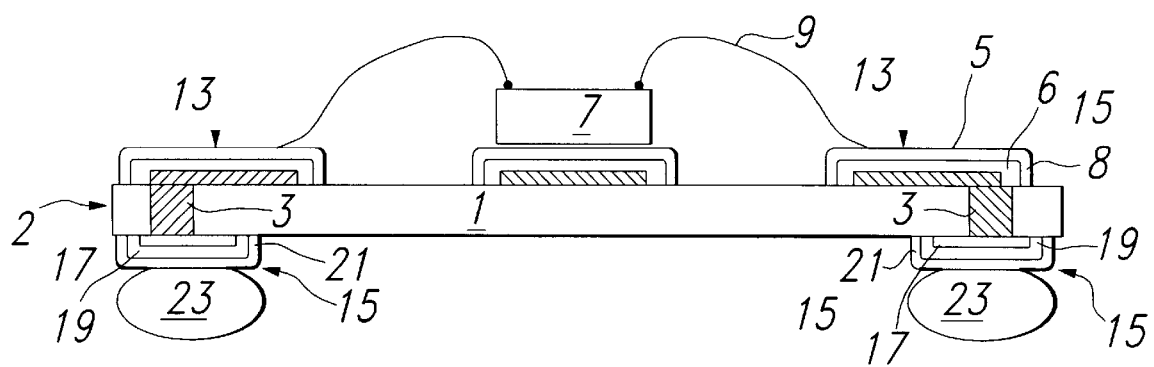

METHOD TO MANUFACTURE BALL GRID ARRAYS WITH EXCELLENT SOLDER BALL ADHESION FOR SEMICONDUCTOR PACKAGING AND THE ARRAY

CROSS REFERENCE TO PRIOR APPLICATIONS

This application claims priority under 35 U.S.C. 119 based upon Provisional Application Ser. No. 60/057,404, filed Aug. 29, 1997.

CROSS REFERENCE TO RELATED APPLICATIONS

This application is related to Ser. No. 08/190,729 and Ser. No. 08/485,077, both of which are incorporated herein by reference.

BACKGROUND OF THE INVENTION

1. Field of the Invention

This invention relates to a method of manufacturing ball grid arrays and the ball grid array.

2. Brief Description of the Prior Art

One form of packaging for semiconductor devices is known as a ball grid array (BGA) package. Such semiconductor packages involve the use of small eutectic solder balls (generally about 0.012 inch in diameter and generally a tin/lead alloy) deposited on a surface of the package which are coupled to circuitry within the package and present a solderable array surface to a circuit board. The solder balls are each attached or placed on the package surface by soldering the balls to a layer of gold generally having a thickness of from about 20 to about 40 microinches. The gold layer rests over a layer of nickel having a thickness generally of about 200 microinches which rests over a copper pad having a thickness of about 0.2 millimeters. The copper pad is on a surface of a dielectric substrate with the combination of the copper, nickel and gold referred to as a plated solder ball attach pad or site. The substrate on which the pad rests is generally a ceramic, laminate or polyimide tape or similar substrate which is the support for the ball grid array. In most cases, the opposite surface of the substrate has metal pads for either flip chip die mounting or wire bonding. These metal pads are connected to the solder ball pads by vias extending through the substrate or the like. In some cases, the solder ball attach pads and the wire bond pads are on the same side of the substrate.

The solder balls must be soldered essentially two times. The first soldering operation takes place during the attachment of the solder balls to the package (i.e., to the solder ball attach pads on the substrate) during package assembly and the second soldering operation involves reflow of the solder balls to the circuit board during device mounting.

A recurrent problem in ball grid array devices is that of adhesion of the solder balls to the package substrate. It is postulated that this problem may, in fact, be caused by gold embrittlement of the solder ball in a narrow region within the solder ball. This problem may occur either by having too much gold on the substrate or by having insufficient heat, thereby not allowing the gold to diffuse fully into the solder ball. Either condition can lead to a brittle region which is caused by having a high concentration of gold in the solder within the ball which can result in cracking and separation of the solder ball from the substrate. This separation can lead to a variety of problems such as, for example, open or faulty circuit connections.

SUMMARY OF THE INVENTION

In accordance with the present invention, the above described problems of the prior art are minimized if not eliminated.

Briefly, the gold content which is postulated to cause the above described problems inherent in the prior art is eliminated from the system and replaced with a thin coating of from about 3 to about 10 microinches of palladium over the layer of nickel of the prior art. The palladium layer is as thin as possible concomitant with obtaining the desired function of the palladium which is to protect the nickel from oxidizing. The nickel layer is preferably about 200 microinches as in the prior art and prevents copper diffusion from the high dielectric substrate copper metalization to the solder connection.

In accordance with the present invention, there is provided a ball grid array wherein the solder balls of the array are soldered to solder ball attach pads or sites wherein the sites include an initial layer of copper of almost any thickness. The copper, which can be on one or opposing surfaces of the package, is coated with a layer of nickel which has sufficient thickness to prevent migration of the copper to the solder ball and is generally about 200 microinches. The layer of nickel is coated with a layer of palladium which is as thin as possible, but sufficiently thick to prevent oxidation of the nickel, this thickness generally being at least 3 microinches and generally up to about 10 microinches, the upper limit being defined more by economics than the properties required of the palladium layer. The solder ball is then soldered to the nickel layer in the same manner as in the prior art, during which soldering operation, the palladium will diffuse into the solder ball. This is generally for from about 10 to about 30 seconds at a temperature of from about 200 to about 225 degrees C and preferably for a period of about 10 seconds at a temperature of about 220 degrees C. It should be understood that these times and temperatures will vary, depending upon the solder composition. The temperatures and times provided herein are for eutectic Sn/Pb solder (60/40) and would differ for other solder pastes, such as, for example, lead free pastes.

Advantages obtained in accordance with the present invention are lower cost by a factor of about 60 as compared with the cost of the gold layer of the prior art since the use of up to about a 40 microinch layer of gold is replaced by an about 3 microinch layer of palladium. In addition, the potential of failure due to gold embrittlement is completely eliminated by the elimination of gold from the fabrication. Also, there is provided a bondable surface for wire bond or flip chip. Still further, the required use of cyanides in conjunction with the use of gold is eliminated, thereby providing an environmentally more friendly procedure in the plating of the substrate.

BRIEF DESCRIPTION OF THE DRAWING

The drawing is a schematic diagram of a cross section of a ball grid array in accordance with the present invention.

DESCRIPTION OF THE PREFERRED EMBODIMENT

Referring to the FIGURE, there is shown a portion of a substrate which includes a supporting dielectric 1 which can be a flexible polyimide and which includes vias 3 extending therethrough. One surface of the substrate 1 includes a 2 mil thick copper trace 5 which is coated with a 200 microinch layer of nickel 6 over which is plated a 3 microinch layer of palladium 8 to provide bondability and which is coupled by metalization in the vias 3 to electrically conductive material on the opposing surface of the substrate as will be discussed hereinbelow. A semiconductor chip 7 is shown secured to the one surface and having a gold wire 9 bonded to and extending from a pad (not shown) on the chip to a wire bond region 13 on the one surface which can be a part of a lead pattern with the same copper, nickel and palladium layers 5, 6 and 8 discussed above. The wire bond surface 13 is coupled to the metalization in the via 3.

A solder ball attach region 15 is provided on the opposing surface of the substrate 1 which is coupled to the metalization in the vias 3. The solder ball attach region 15 includes a 2 mil thick layer of copper 17 which is directly coupled to the metalization within the vias 3. A 200 microinch layer of nickel 19 is deposited over the copper layer and prevents migration of the copper to the palladium 21. The palladium layer 21 has a thickness of 3 microinches and serves to prevent oxidation of the nickel layer 19. A solder ball 23 which is an alloy of tin and lead of the type which is standard in the art is then soldered in standard manner to the solder ball attach region. During the soldering operation, the palladium from the palladium layer 21 will diffuse into the solder ball 23 with the connection of the solder ball being made directly to the nickel layer 19. The device is now ready for later further soldering via the solder balls to a printed circuit board of the like in standard manner.

Though the invention has been described with reference to a specific preferred embodiment thereof, many variations and modifications will immediately become apparent to those skilled in the art. It is therefore the intention that the appended claims be interpreted as broadly as possible in view of the prior art to include all such variations and modifications.

What is claimed is:

1. A ball grid array which comprises:
   (a) an electrically insulating substrate;
   (b) an essentially gold-free solder ball attach region secured to said substrate which includes:
      (i) a layer of electrically conductive material on said substrate;
      (ii) a layer of nickel over said layer of electrically conductive material; and
      (iii) a layer of palladium over said layer of nickel; and
   (c) a solder ball extending through and incorporating therein at least a portion of said layer of palladium and extending to said layer of nickel.

2. The array of claim 1 wherein said substrate is one of polyimide or ceramic.

3. The array of claim 1 wherein said electrically conductive material is copper.

4. The array of claim 2 wherein said electrically conductive material is copper.

5. The array of claim 1 wherein said layer of palladium has a thickness of from about 3 to about 10 microinches.

6. The array of claim 2 wherein said layer of palladium has a thickness of from about 3 to about 10 microinches.

7. The array of claim 3 wherein said layer of palladium has a thickness of from about 3 to about 10 microinches.

8. The array of claim 4 wherein said layer of palladium has a thickness of from about 3 to about 10 microinches.

9. A method of fabricating a ball grid array which comprises the steps of:
   (a) providing an electrically insulating substrate;
   (b) forming an essentially gold-free solder ball attach region secured to said substrate which includes the steps of
      (i) forming a layer of electrically conductive material on said substrate;
      (ii) forming a layer of nickel over said layer of electrically conductive material; and
      (iii) forming a layer of palladium over said layer of nickel; and
   (c) applying a solder ball to said layer of palladium and heating said solder ball and said solder ball attach region to a temperature sufficiently high and for a sufficient time so that said solder ball extends through and incorporates therein at least a portion of said layer of said palladium and extending to and attaches to said layer of nickel.

10. The method of claim 9 wherein said substrate is one of polyimide or ceramic.

11. The method of claim 9 wherein said electrically conductive material is copper.

12. The method of claim 10 wherein said electrically conductive material is copper.

13. The method of claim 9 wherein said layer of palladium has a thickness of from about 3 to about 10 microinches.

14. The method of claim 10 wherein said layer of palladium has a thickness of from about 3 to about 10 microinches.

15. The method of claim 11 wherein said layer of palladium has a thickness of from about 3 to about 10 microinches.

16. The method of claim 12 wherein said layer of palladium has a thickness of from about 3 to about 10 microinches.

* * * * *